United States Patent
Chen et al.

(10) Patent No.: US 10,263,623 B1
(45) Date of Patent: Apr. 16, 2019

(54) CIRCUIT FOR AND METHOD OF STORING DATA IN AN INTEGRATED CIRCUIT DEVICE

(71) Applicant: Xilinx, Inc., San Jose, CA (US)

(72) Inventors: Yanran Chen, San Jose, CA (US); Pierre Maillard, Campbell, CA (US); Michael J. Hart, Palo Alto, CA (US)

(73) Assignee: XILINX INC., San Jose, CA (US)

( * ) Notice: Subject to any disclaimer, the term of this patent is extended or adjusted under 35 U.S.C. 154(b) by 0 days.

(21) Appl. No.: 16/107,751

(22) Filed: Aug. 21, 2018

(51) Int. Cl.
| | |
|---|---|
| *G11C 17/18* | (2006.01) |
| *H03K 19/173* | (2006.01) |
| *H03K 17/00* | (2006.01) |
| *G11C 11/412* | (2006.01) |
| *H03K 19/003* | (2006.01) |

(52) U.S. Cl.
CPC ...... *H03K 19/1737* (2013.01); *G11C 11/4125* (2013.01); *H03K 17/005* (2013.01); *H03K 19/00338* (2013.01)

(58) Field of Classification Search
CPC ......... H03K 19/1737; H03K 19/00338; H03K 17/005; G11C 11/4125
USPC ......................................................... 326/38
See application file for complete search history.

(56) References Cited

U.S. PATENT DOCUMENTS

| | | | |
|---|---|---|---|
| 5,173,870 A * | 12/1992 | Sukashita | G06F 7/503 327/208 |
| 5,281,865 A * | 1/1994 | Yamashita | H03K 3/037 326/56 |
| 5,508,648 A * | 4/1996 | Banik | H03K 3/35625 327/203 |
| 5,828,231 A | 10/1998 | Bazargan | |
| 6,735,110 B1 | 5/2004 | Lesea | |
| 6,822,894 B1 | 11/2004 | Costello et al. | |
| 6,903,571 B1 | 6/2005 | Trimberger | |
| 6,914,804 B2 | 7/2005 | Lesea | |
| 7,064,574 B1 | 6/2006 | Voogel et al. | |
| 7,111,215 B1 | 9/2006 | Keller et al. | |
| 7,132,870 B2 * | 11/2006 | Linam | H03K 3/0372 327/202 |
| 7,139,190 B1 | 11/2006 | de Jong | |
| 7,386,826 B1 | 6/2008 | Keller et al. | |
| 7,764,081 B1 | 7/2010 | Tuan et al. | |
| 7,990,173 B1 | 8/2011 | Tseng et al. | |

(Continued)

OTHER PUBLICATIONS

Karp, James et al., "Single-Event Latch-Up: Increased Sensitivity From Planar to FinFET," IEEE Trans. Nucl. Sci., Jan. 2018, pp. 217-222, vol. 65, Issue 1, IEEE, Piscataway, New Jersey, USA.

*Primary Examiner* — Don P Le
(74) *Attorney, Agent, or Firm* — John J. King (57) ABSTRACT

A circuit for storing data in an integrated circuit is described. The circuit comprises an inverter comprising a first transistor having a first gate configured to receive input data and a first output configured to generate a first inverted data output and a second transistor having a second gate configured to receive the input data and a second output configured to generate a second inverted data output; a first pass gate coupled to the first output of the inverter; a second pass gate coupled to the second output of the inverter; and a storage element having an input coupled to receive an output of the first pass gate and an output of the second pass gate. A method of storing data in an integrated circuit is also described.

20 Claims, 4 Drawing Sheets

(56) References Cited

U.S. PATENT DOCUMENTS

| | | | |
|---|---|---|---|
| 8,065,644 B1 | 11/2011 | Jacobson et al. | |
| 8,261,229 B2 | 9/2012 | Hart | |
| 8,635,581 B1 | 1/2014 | Tseng et al. | |
| 8,692,381 B1 | 4/2014 | Hart | |
| 9,183,338 B1 | 11/2015 | Jain et al. | |
| 9,483,599 B1 | 11/2016 | Mizawa et al. | |
| 9,825,632 B1 | 11/2017 | Maillard et al. | |
| 2006/0028259 A1* | 2/2006 | Aksamit | G01R 31/318541 327/202 |
| 2007/0171713 A1* | 7/2007 | Hunter | G11C 11/412 365/185.07 |
| 2008/0136481 A1* | 6/2008 | Chung | H01L 29/0649 327/201 |
| 2008/0192561 A1* | 8/2008 | Huang | G11C 11/412 365/230.05 |
| 2009/0267671 A1* | 10/2009 | Brown | G06F 17/5036 327/202 |
| 2013/0222031 A1* | 8/2013 | Behrends | H03K 3/012 327/203 |
| 2014/0022004 A1* | 1/2014 | Luo | H01L 23/62 327/525 |
| 2016/0056801 A1* | 2/2016 | Cai | H03K 3/35625 327/203 |

\* cited by examiner

CIRCUIT FOR AND METHOD OF STORING DATA IN AN INTEGRATED CIRCUIT DEVICE

TECHNICAL FIELD

The present invention relates generally to integrated circuit devices, and in particular, to a circuit for and a method of storing data in an integrated circuit device.

BACKGROUND

Memory elements, such as D flip-flops (DFF), are subject to upset from radiation elements, such as cosmic neutrons and terrestrial alpha particles. The failure rate associated with these upsets is commonly known as a Soft Error Rate (SER), and the industrial metric used to quantify the SER of the circuit is known as a Failure In Time (FIT) rate or FIT/Mb. Master/Slave dual-interlocked storage cell (DICE) Single-Event Upset (SEU) flip-flops (FF) are designed to reduce the SER of a DFF following energetic particles irradiation.

In a typical field programmable gate array (FPGA) design having a Master-Slave flip-flop, the clock is most likely in a '0' state, i.e. the Slave is in a latch mode. Therefore, converting a Slave portion of a Master/Slave memory device to DICE while keeping the Master portion as typical D-latch would reduce the overall FF FIT rate while minimizing area and performance penalty.

However, this implementation results in the Master D-latch having unbalanced load between the two storage nodes, which causes a switching frequency difference for '0-1' and '1-0' transitions.

Accordingly, there is a need for a memory cell that improves the FIT rate.

SUMMARY

A circuit for storing data in an integrated circuit device is described. The circuit comprises an inverter comprising a first transistor having a first gate configured to receive input data and a first output configured to generate a first inverted data output and a second transistor having a second gate configured to receive the input data and a second output configured to generate a second inverted data output; a first pass gate coupled to the first output of the inverter; a second pass gate coupled to the second output of the inverter; and a storage element having an input coupled to receive an output of the first pass gate and an output of the second pass gate.

Another circuit for storing data in an integrated circuit device comprises a Master-Slave storage element having a Master storage element coupled to receive input data and a Slave storage element coupled to an output of the Master storage element; an inverter comprising a first transistor having a first gate coupled to an output of the Master storage element and a first output configured to generate a first inverted data output, and a second transistor having a second gate coupled to the output of the Master storage element and a second output configured to generate a second inverted data output; a first pass gate coupled between the first output of the inverter and an input of the Slave storage element; and a second pass gate coupled between the second output of the inverter and the input of the Slave storage element.

A method of storing data in an integrated circuit device is also described. The method comprises configuring a first gate of a first transistor of an inverter to receive the input data, wherein first inverted data is generated at a first output of the inverter; configuring a second gate of a second transistor of the inverter to receive input data, wherein second inverted data is generated at a second output of the inverter; coupling a first pass gate to the first output of the inverter; coupling a second pass gate to the second output of the inverter; and coupling a storage element to receive an output of the first pass gate and an output of the second pass gate.

DETAILED DESCRIPTION

Transistor dimensions continue to decrease with technological improvements, which lead to improvements in the operation and a reduction in size of integrated circuit devices having the transistors with reduced dimensions. One dimension that may have a reduced size is a channel length (i.e. the length between a source and drain of a MOS transistor of a transistor). For example, a transistor may be reduced from a 16 nanometer (nm) channel length to a 7 nm channel length. While reduced channels lengths provide improvements, they also can have some unintended adverse effects. When going from a 16 nm channel length to a 7 nm channel length, a critical charge (Qcrit) of FFs may be increased significantly because of the process and physical dimension change from a planar arrangement to a fin field effect transistor (FinFET) arrangement. A conventional SEU FF Master latch exhibits a greater than 10 times SEU cross section (i.e. FIT) for an input of '1' compared to an input of '0' for terrestrial neutrons. For 7 nm channel transistors and smaller, loading at the master latch Q (mq) node is greater than the loading at the Master latch Qbar (mqb) node, and is a main reason for the observed FIT asymmetry between inputs.

The circuits and methods increase the load for mqb node, which can help significantly reduce the SEU cross-section for input of '1' so that it is the same level with input of '0'. The circuits and methods also improve the Soft Error Rate of a D flip-flop cell. The split-node inverter arrangement balances loading at two storage nodes of the FF Master latch and utilizes the intrinsic parasitic loading of added pass gate pairs to mitigate SEUs in devices using advanced technologies, such as integrated circuit devices having reduced transistor widths. The split node inverter arrangement reduces the overall FF neutron and alpha particle FIT rate by 10 times or more with minimum latency penalty.

According to one implementation, the split-node arrangement can be applied to SEU FF Master latch designs to significantly reduce the overall DFF SEU FIT rate by minimizing the mismatch between state '0' and '1'. The FIT rates of the Master latch are reduced by adding another set of transmission gates parallel to the existing set at the data input. Nodal splitting for a buffered input node in also done to lower the cell FIT rate, where the input to one set of transmission gates is only driven by the NMOS transistor of an inverter and the input to the other set of transmission gates (i.e. pass gates) is only driven by the PMOS transistor of an inverter. When implemented in a Master-Slave flip-flop, the circuits and methods result in the Master D-latch having a more balanced load between the two storage nodes, which reduces any switching frequency difference for '0-1' and '1-0' transitions. According to another implementation, the split-node arrangement can also be applied to the Master/Slave latches in a standard DFF.

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

Figure 1:
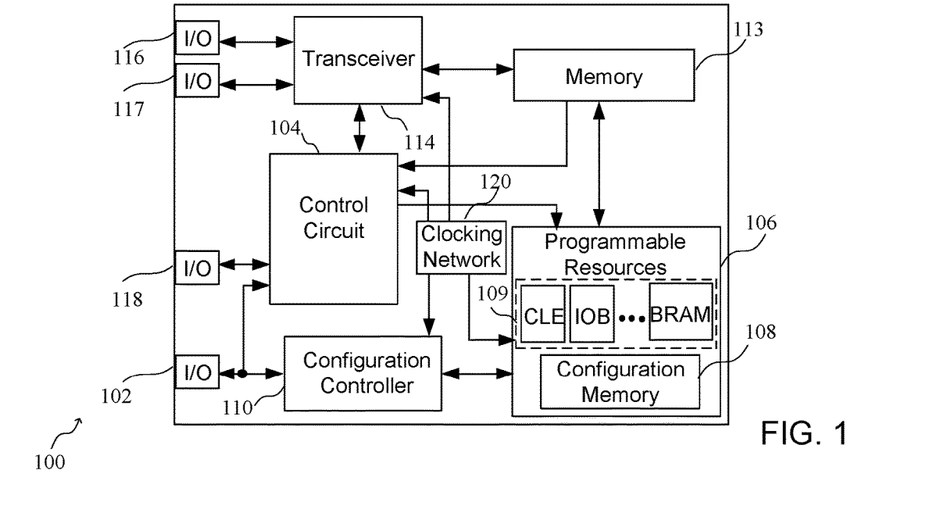
FIG. 1 is a block diagram of an integrated circuit having circuits for storing data.

Turning first to FIG. 1, a block diagram of an integrated circuit device 100 having a transceiver for transmitting and receiving data is shown. In particular, an input/output port 102 is coupled to a control circuit 104 that controls programmable resources 106 having configurable logic elements 109 and other programmable resources, such as input/output blocks (IOBs) and blocks of random access memory (BRAMs). Configuration data may be provided to the configuration memory 108 by a configuration controller 110. The configuration data enables the operation of the programmable resources 106. A memory 113 may be coupled to the control circuit 104 and the programmable resources 106. A transceiver circuit 114, which comprises a transmitter and a receiver, may be coupled to the control circuit 104, programmable resources 106 and the memory 113, and may receive signals at the integrated circuit by way of I/O ports 116 and 117. Other I/O ports may be coupled to circuits of the integrated circuit device, such as I/O port 118 that is coupled to the control circuit 104 as shown. A clocking network 120 is coupled to various elements of the circuit of FIG. 1. While the circuit of FIG. 1 is provided by way of example, other circuits of implementing memory elements and other circuits for storing data in memory elements could be used.

Figure 2:
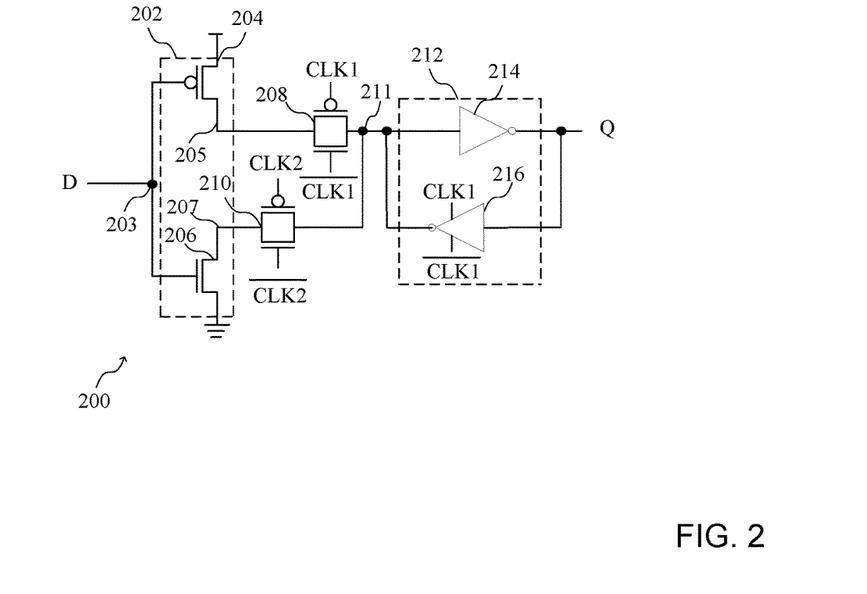
FIG. 2 is a block diagram of a circuit for storing data in an integrated circuit device.

Turning now to FIG. 2, a block diagram of a circuit 200 for storing data in an integrated circuit device is shown. According to the implementation of FIG. 2, the circuit 200 comprises an inverter 202 having an input 203 comprising a gate of a P-channel transistor 204 and a gate of an N-channel transistor 206 for receiving input data (D). The inverter comprises a split node output having a first output 205 at a drain of the P-channel transistor 204 and second output 207 at a drain of the N-channel transistor 206. That is, the P-channel transistor is coupled between a reference voltage, such as VCC for example, and the output 205 for generating a high output (i.e. logical 1) in response to low input data (D), while the N-channel transistor 206 is coupled between the output 207 and ground for generating a low value (i.e. logical 0) in response to high input data (D). The first output 205 and the second output 207 are electrically isolated by implementing the split output inverter to mitigate SEUs. While P-channel and N-channels are shown by way of example, it should be understood that other arrangements of circuit elements could be implemented, where the outputs for a low signal and a high signal are electrically isolated.

A pair of pass gates is coupled to the outputs of inverter 202, and to an input of a latch. More particularly, a first pass gate 208, shown by way of example as comprising a P-channel transistor and an N-channel transistor having their sources and drains coupled together and receiving a first clock (CLK1) and a first inverted clock (CLK1_bar), enables passing the signal at the output 205 to an input 211 of storage element, shown here by way of example as a latch 212. A second pass gate 210, also shown by way of example as comprising a P-channel transistor and an N-channel transistor having their sources and drains coupled together and receiving the second clock (CLK2) and a second inverter clock (CLK2_bar), enables passing to the signal at the output 207 to the input 211 of a latch 212. The latch 212 comprises a pair of back-to-back inverters 214 and 216 to generate the output data (Q). While the first pass gate 208 is coupled to receive the first clock signal CLK1 and the second pass gate 210 is configured to receive the second clock signal CLK2, it should be understood that both pass gates could receive the same clock signal. Further, while the latch 212 is configured to operate using the first clock signal CLK1, a different clock signal, such as clock signal CLK2, could be used. While the pass gates 208 and 210 are shown as having complementary transistors (i.e. both a PMOS transistor and an NMOS transistor), it should be understood that the pass gates 208 and 210, or other pass gates shown in later figures, could be include only a single transistor (i.e. either the PMOS transistor or the NMOS transistor).

Accordingly, the split-node arrangement can be applied to an SEU FF Master latch design to significantly reduce the overall DFF SEU FIT rate by minimizing the mismatch between states '0' and '1'. The FIT rates of the Master latch are reduced by adding another set of transmission gates parallel to the existing set at the data input. Nodal splitting for a buffered input node in also done to lower the cell FIT rate, where the input to one set of transmission gates is only driven by the NMOS transistor of an inverter and the input to the other set of transmission gates is only driven by the PMOS transistor of an inverter. According to another implementation, the split-node arrangement can also be applied to the Master/Slave latches in a standard DFF, as will be described in reference to FIG. 5.

Figure 3:
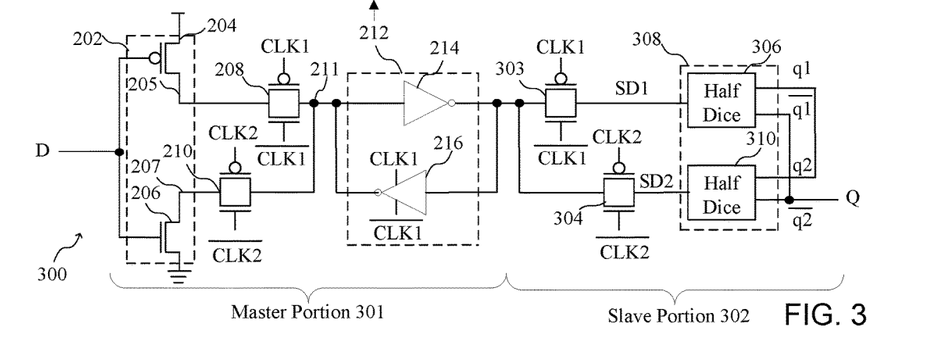
FIG. 3 is a block diagram of a master-Slave circuit for storing data in an integrated circuit device.
Figure 4:
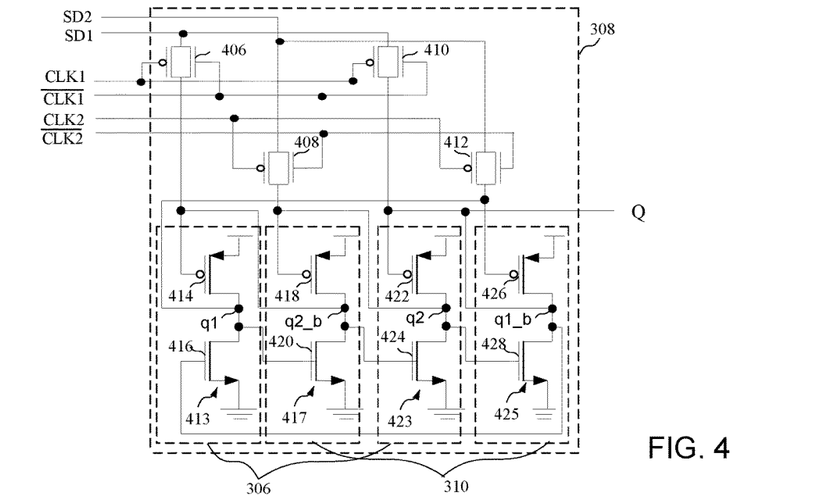
FIG. 4 is a block diagram of a DICE memory cell.

Turning now to FIG. 3, a block diagram of a Master-Slave circuit 300 for storing data in an integrated circuit device is shown. More particularly, a Master-Slave arrangement can be implemented using a split node inverter that controls a latch of a master portion 301 as described in reference to FIG. 2, an output of which is coupled to a Slave portion 302. The Slave portion 302 comprises a first pass gate 303 having a pair of P-channel and N-channel transistors having their sources and drains tied together and receiving the clock signal CLK1 and inverted clock signal CLK1_bar, and a second pass gate 304 having a pair of P-channel and N-channel transistors having their sources and drains tied together and receiving the second clock signal CLK2 and the inverted second clock signal CLK2_bar as shown. The first pass gate 303 enables passing output data from the latch 212 to a first half DICE 306 of a DICE 308 of the Slave portion 302 to generate the q1 and q1_b signals. A DICE circuit having a first half DICE and a second half DICE is shown in FIG. 4. The second pass gate 304 enables passing output data from the latch 212 to a second half DICE 310 of the Slave portion 302 to generate the q2 and q2_b signals. By splitting the output node of the invertor 202, the loading of the two nodes at the input to the Master memory element can be balanced, and SEUs significantly mitigated for the standard DFF with a minimal cost of additional transistors for the additional pass gates.

Turning now to FIG. 4, a block diagram of a DICE memory cell is shown. A plurality of pass gates 406-412 are configured to control the application of the output of the Master portion 301 of the Master-Slave circuit 300 to inverters as a first slave data input (SD1) and a second Slave data input (SD2) in response to clock signals. In particular, the pass gates 406 and 410 are coupled to receive SD1 in response to the first clock signal (CLK1) and the inverted first clock signals (CLK1_B). The pass gates 408 and 412 are coupled to receive SD2 in response to the second clock signal (CLK2) and the inverted second clock signal (CLB2_B).

The outputs of the pass gates are coupled to inverters that are configured in the DICE configuration. More particularly, the output of the pass gate 406 is coupled to an inverter 413 at a gate of a transistor 414 having a source pulled high and a drain coupled to a drain of a transistor 416 which has a source coupled to ground. The node of the inverter 413 at the connection of the drain of transistor 414 and the drain of transistor 416 comprises an inverter node. The gate of transistor 416 is controlled by an inverter node of another path of the flip-flop, as will be described below. The pass gate 408 also comprises a pair of transistors and has an output coupled to an inverter 417 comprising a transistor 418 and a transistor 420. The node at the drain of the transistors 418 and the source of the transistor 420 generates an inverted output signal q2_b. The output of the pass gate 408 is coupled to the gate of the transistor 418 which has a source pulled high and a drain coupled to the drain of the transistor 420. The gate of transistor 420 is coupled to receive the output signal q1 at the inverter node between transistors 414 and 416

The output of the pass gate 410 is coupled to a gate of a transistor 422 of an inverter 423 having a source pulled high and a drain coupled to a drain of a transistor 424 which has a source coupled to ground. The node at the connection of the drain of transistor 422 and the drain of transistor 424 comprises an inverter node that generates an output signal q2. The gate of transistor 424 is controlled by the inverted output signal q2_b at the inverter node of the inverter created by transistors 418 and 420. Finally, the output of the pass gate 412 is coupled to the gate of the transistor 426 which has a source pulled high and a drain coupled to the drain of the transistor 428 to receive the q2 signal. The gate of transistor 428 is coupled to receive the signal at the inverter node between transistors 422 and 424. The node at the drain of the transistor 426 and the source of the transistor 428 is coupled to the gate of the transistor 416, which receives the inverted output q1_b. The first half dice 306 comprises inverters 413 and 423 and the second half dice 310 comprises inverters 417 and 425.

Figure 5:
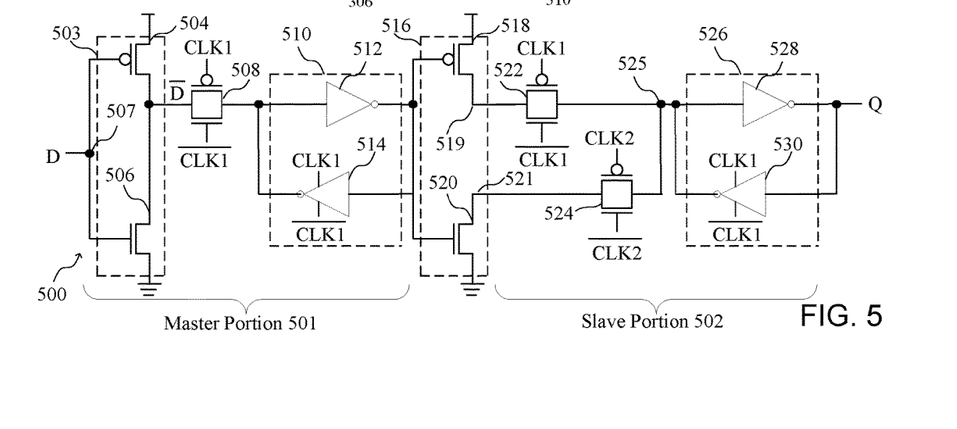
FIG. 5 is another block diagram of a Master-Slave circuit for storing data in an integrated circuit device.

Turning now to FIG. 5, another block diagram of a Master-Slave circuit 500 having a Master portion 501 and a Slave portion 502 for storing data in an integrated circuit device is shown. The Master portion 501 comprises an inverter 503 having a P-channel transistor 504 coupled in series with an N-channel transistor 506. The inverter 503 comprises an input 507 coupled to receive the input data (D) and coupled to the gates of the transistors 504 and 506. A pass gate 508 having a pair of P-channel and N-channel transistors is coupled to the drains of the transistors 504 and 506 and provides and inverted data signal (D-bar) to latch 510. The latch 510 comprises a pair of back-to-back inverters 512 and 514 as shown, but could comprise a different type of memory element. An inverter 516 having a split node at the output is provided between the Master portion 501 and the Slave portion 502. The inverter 516 comprises a P-channel transistor 518 having a source coupled to a reference voltage, such as VCC for example, and a drain coupled to a first output 519. The inverter 516 also comprises an N-channel transistor 520 having a drain coupled to a second output 521 and a source coupled to ground. The output 519 is coupled to a first pass gate 522 having a pair of P-channel and N-channel transistors, and the second output 521 is coupled to a second pass gate 524 having a pair of P-channel and N-channel transistors, where each pass gate is coupled to an input 525 of a latch 526. More particularly, the latch 526 comprises a pair of back-to-back inverters 528 and 530 coupled as shown to generate output data Q.

Figure 6:
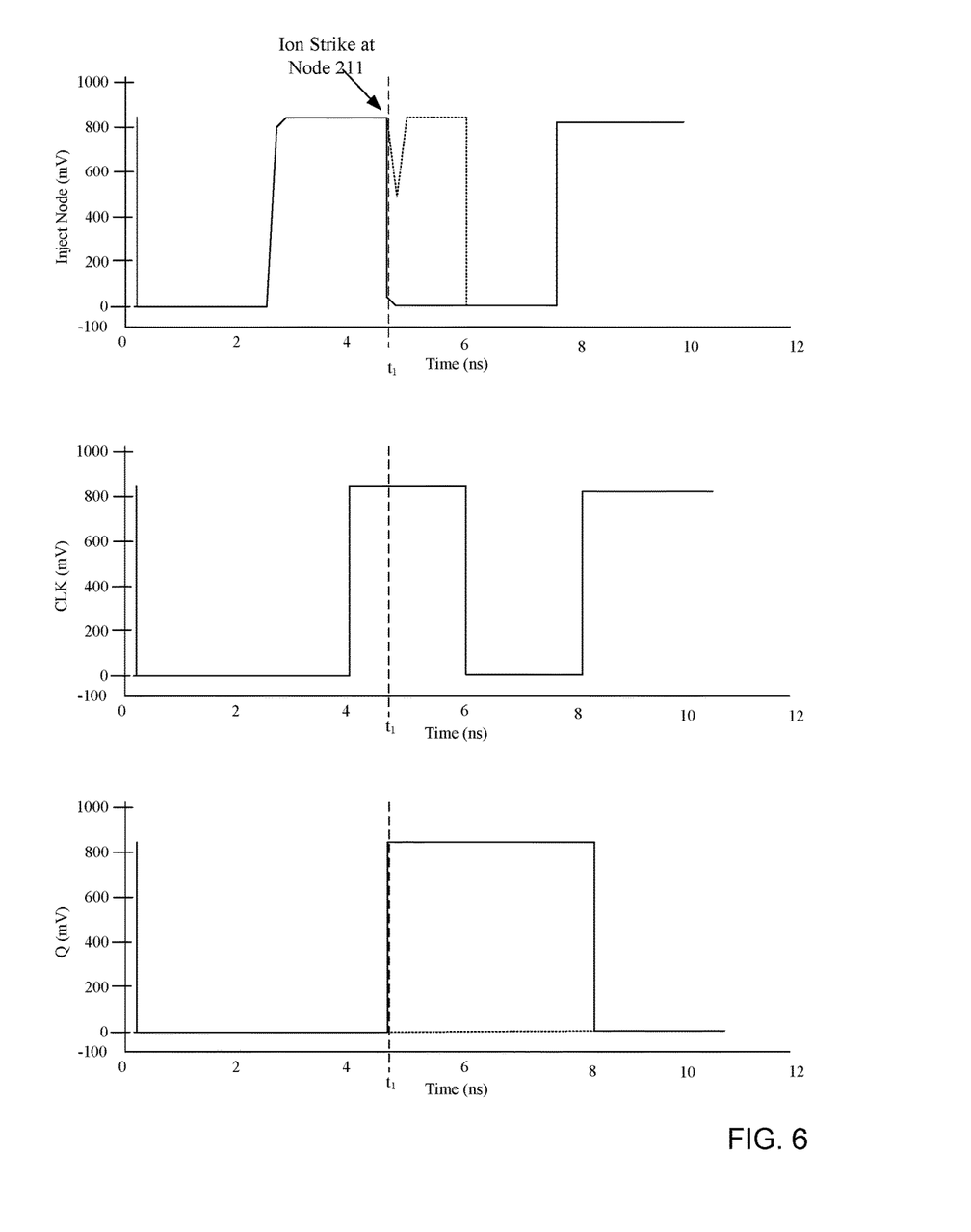
FIG. 6 includes timing diagrams showing the operation of the circuit for storing data.

Turning now to FIG. 6, timing diagrams, which show an injection node, the clock signal, and an output value Q on corresponding timelines, show the operation of the circuits for storing data as set forth above. More particularly, an event that may cause an SEU, such as an ion strike at node 211, may occur at time ti. As can be seen in the FIG. 1, when an ion strike at node 211 occurs, the node 211 drops to 0 volts, rather than tracking the clock (CLK) signal shown in the middle timing diagram. However, by implementing the split node output of the inverter 202, the injection node 211 does not drop to zero volts at time ti. Rather, the voltage at the node 211 dips slightly for a short period of time as shown by the dashed line, but generally continues to tract the CLK signal, and goes to zero volts at approximately 6 ms. Further, the output Q remains low during that period as shown by the dashed line.

Figure 7:
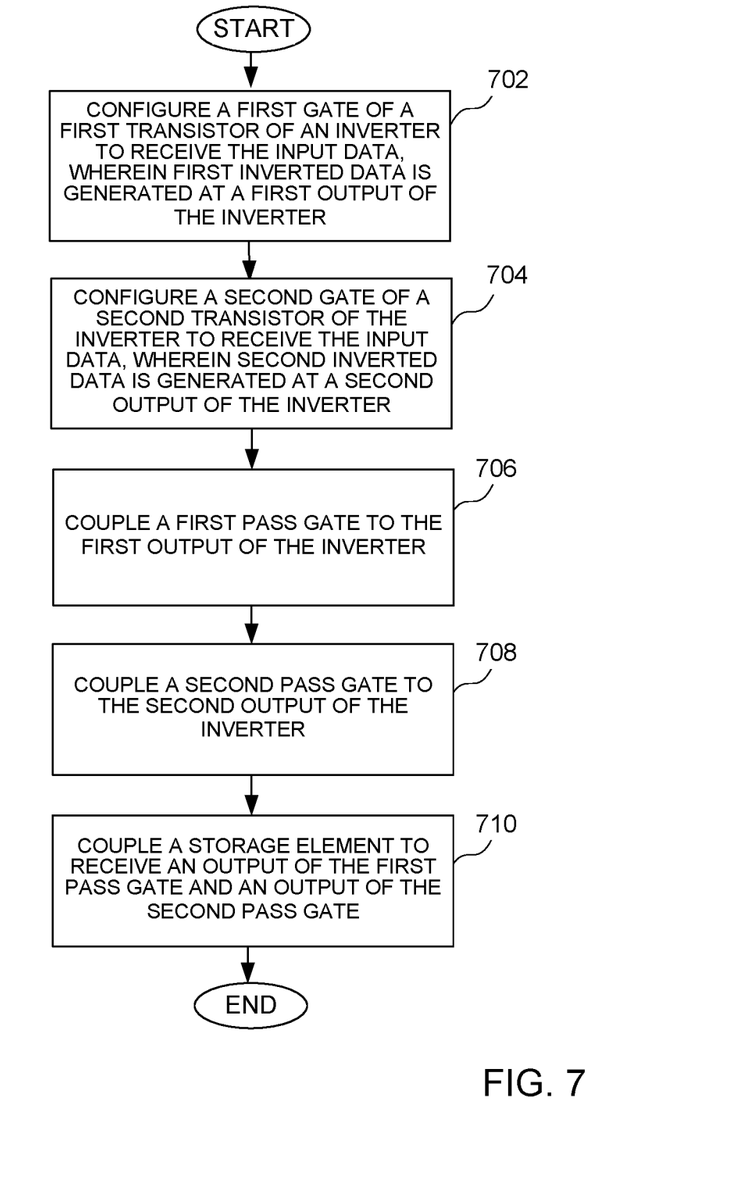
FIG. 7 is a flow chart showing a method of storing data in an integrated circuit device.

Turning now to FIG. 7, a flow chart shows a method of storing data in an integrated circuit device. More particularly, a first gate of a first transistor of an inverter is configured to receive the input data, wherein first inverted data is generated at a first output of the inverter at a block 702. The first inverter could be inverter 202 of FIGS. 2 and 3, or inverter 504 or FIG. 5. A second gate of a second transistor of the inverter is configured to receive the input data, wherein second inverted data is generated at a second output of the inverter at a block 704. A first pass gate is coupled to the first output of the inverter at a block 706. A second pass gate is coupled to the second output of the inverter at a block 708. The first pass gates may be pass gate 208 and the second pass gate may be pass gate 210 for example. A storage element, such at storage element 212 or storage element 26 is coupled to receive an output of the first pass gate and an output of the second pass gate at a block 710.

According to some implementations, the first transistor of the inverter comprises a P-channel transistor and the second transistor comprises an N-channel transistor, wherein the P-channel transistor and the N-channel transistor are coupled in series between a reference voltage and a ground voltage. The method may further comprise electrically isolating the first output of the inverter and the second output of the inverter. Coupling a storage element to receive an output of the first pass gate and an output of the second pass gate may comprise coupling an input of a latch to receive an output of the first pass gate and an output of the second pass gate. Coupling a storage element to receive an output of the first pass gate and an output of the second pass gate may comprise coupling a Master storage element of a Master-Slave storage element to receive an output of the first pass gate and an output of the second pass gate. According to some implementations, the Slave storage element comprises a Dice storage element, wherein the method further comprises coupling a third pass gate between the output of the Master storage element and a first half DICE of the Slave storage element and coupling a fourth pass gate between the output of the Master storage element and a second half DICE of the Slave storage element.

The method of FIG. 7 may be implemented using the circuits of FIGS. 1-6 as described, or using some other suitable circuits. While specific elements of the method are described, it should be understood that additional elements of the method, or additional details related to the elements, could be implemented according to the disclosure of FIGS. 1-6.

It can therefore be appreciated that new circuits for and methods of storing data in an integrated circuit have been described. It will be appreciated by those skilled in the art that numerous alternatives and equivalents will be seen to exist that incorporate the disclosed invention. As a result, the invention is not to be limited by the foregoing implementations, but only by the following claims.

What is claimed is:

1. A circuit for storing data in an integrated circuit device, the circuit comprising:
    an inverter comprising a first transistor having a first gate configured to receive input data and a first output configured to generate a first inverted data output and a second transistor having a second gate configured to receive the input data and a second output configured to generate a second inverted data output;
    a first pass gate coupled to the first output of the inverter;
    a second pass gate coupled to the second output of the inverter; and
    a storage element having an input coupled to receive an output of the first pass gate and an output of the second pass gate.

2. The circuit of claim 1, wherein the first transistor of the inverter comprises a P-channel transistor and the second transistor comprises an N-channel transistor, wherein the P-channel transistor is coupled between a reference voltage and the first output and the N-channel transistor is coupled between the second output and a ground voltage.

3. The circuit of claim 1, wherein the first output of the inverter and the second output of the inverter are electrically isolated.

4. The circuit of claim 1, wherein the storage element comprises a latch.

5. The circuit of claim 1, wherein the circuit comprises a Master-Slave storage element having a Master storage element and a Slave storage element.

6. The circuit of claim 5, wherein the Slave storage element comprises a DICE storage element.

7. The circuit of claim 6, further comprising a third pass gate coupled between an output of the Master storage element and a first half DICE of the Slave storage element and a fourth pass gate coupled between the output of the Master storage element and a second half DICE of the Slave storage element.

8. A circuit for storing data in an integrated circuit device, the circuit comprising:
    a Master-Slave storage element having a Master storage element coupled to receive input data and a Slave storage element coupled to an output of the Master storage element;
    an inverter comprising a first transistor having a first gate coupled to an output of the Master storage element and a first output configured to generate a first inverted data output, and a second transistor having a second gate coupled to the output of the Master storage element and a second output configured to generate a second inverted data output;
    a first pass gate coupled between the first output of the inverter and an input of the Slave storage element; and
    a second pass gate coupled between the second output of the inverter and the input of the Slave storage element.

9. The circuit of claim 8, wherein the first transistor of the inverter comprises a P-channel transistor and the second transistor comprises an N-channel transistor, wherein the P-channel transistor is coupled between a reference voltage and the first output and the N-channel transistor is coupled between the second output and a ground voltage.

10. The circuit of claim 8, wherein the first output of the inverter and the second output of the inverter are electrically isolated.

11. The circuit of claim 8, wherein the Master storage element comprises a latch.

12. The circuit of claim 11, wherein the Slave storage element comprises a latch.

13. The circuit of claim 8, further comprising a second invertor coupled to the Master-Slave storage element, wherein the second inverter is configured to receive the input data and generate inverted input data that is provided to an input of the Master storage element.

14. A method of storing data in an integrated circuit device, the method comprising:
    configuring a first gate of a first transistor of an inverter to receive input data, wherein first inverted data is generated at a first output of the inverter;
    configuring a second gate of a second transistor of the inverter to receive the input data, wherein second inverted data is generated at a second output of the inverter;
    coupling a first pass gate to the first output of the inverter;
    coupling a second pass gate to the second output of the inverter; and
    coupling a storage element to receive an output of the first pass gate and an output of the second pass gate.

15. The method of claim 14, wherein the first transistor of the inverter comprises a P-channel transistor and the second transistor comprises an N-channel transistor, wherein the P-channel transistor is coupled between a reference voltage and the first output and the N-channel transistor is coupled between the second output and a ground voltage.

16. The method of claim 14, further comprising electrically isolating the first output of the inverter and the second output of the inverter.

17. The method of claim 14, wherein coupling a storage element to receive an output of the first pass gate and an output of the second pass gate comprises coupling an input of a latch to receive the output of the first pass gate and the output of the second pass gate.

18. The method of claim 14, wherein coupling a storage element to receive an output of the first pass gate and an output of the second pass gate comprises coupling a Master storage element of a Master-Slave storage element to receive the output of the first pass gate and the output of the second pass gate.

19. The method of claim 18, wherein the Slave storage element comprises a Dice storage element.

20. The method of claim 19, further comprising a third pass gate coupled between an output of the Master storage element and a first half DICE of the Slave storage element and a fourth pass gate coupled between the output of the Master storage element and a second half DICE of the Slave storage element.

* * * * *